(12) United States Patent
Yamashita

(10) Patent No.: US 8,296,641 B2
(45) Date of Patent: Oct. 23, 2012

(54) PARITY GENERATION CIRCUIT, COUNTER CIRCUIT, AND COUNTING METHOD

(75) Inventor: Hideo Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 957 days.

(21) Appl. No.: 12/219,313

(22) Filed: Jul. 18, 2008

(65) Prior Publication Data

US 2008/0282136 A1 Nov. 13, 2008

Related U.S. Application Data

(63) Continuation of application No. PCT/JP2006/300749, filed on Jan. 19, 2006.

(51) Int. Cl.
G06F 11/00 (2006.01)
(52) U.S. Cl. .................. 714/801; 714/800; 714/799
(58) Field of Classification Search .............. 714/777, 714/800, 801, 802, 803, 799
See application file for complete search history.

(56) References Cited

U.S. PATENT DOCUMENTS

| | | | | |
|---|---|---|---|---|
| 4,710,934 A | * | 12/1987 | Traynor | 714/765 |
| 4,959,835 A | * | 9/1990 | Yosida et al. | 714/805 |
| 5,402,430 A | * | 3/1995 | Asai et al. | 714/800 |
| 5,717,616 A | | 2/1998 | Morris | |
| 2004/0237003 A1 | * | 11/2004 | Adkisson | 714/47 |

FOREIGN PATENT DOCUMENTS

| | | |
|---|---|---|
| JP | 59-67729 | 4/1984 |
| JP | 64-7830 | 1/1989 |
| JP | 3-105670 | 5/1991 |
| JP | 6-250823 | 9/1994 |
| JP | 2005-165793 | 6/2005 |

OTHER PUBLICATIONS

Extended European Search Report for corresponding European Application 06711995.8; mailed May 10, 2010.
Shand, Mark, "A Case Study of Algorthim Impementationin Reconfiguration Hardware and Software", XP-00257988; 1997; http://www.springerlink.com/content/c37090g0667904n7/fulltext. pdf.
Shand, Mark, "A Case Study of Algorthim Impementationin Reconfiguration Hardware and Software", XP-002579888; 1997; http://www.springerlink.com/content/c37090g0667904n7/fulltext. pdf.

* cited by examiner

Primary Examiner — Scott Baderman
Assistant Examiner — Sarai Butler
(74) Attorney, Agent, or Firm — Staas & Halsey LLP

(57) ABSTRACT

A circuit outputs, upon receipt of data and a parity of the data, count information on the number of bits in the data represented as a base-n number (n: a natural number equal to or larger than 2) and the parity of the count information. The circuit includes a determining unit and an inverting unit. The determining unit determines that the number of bits in the data represented as a base-n number is a specific value. The inverting unit outputs, as the parity of the count information, any one of a value of the parity of the data and an inverted value of the parity depending on a result of determination by the determining unit.

10 Claims, 11 Drawing Sheets

FIG.1A

| | X 7:0 | P | Z 3:0 | P |
|---|---|---|---|---|
| * | 0000 0000 | 1 | 0000 | 1 |
| * | 0000 0001 | 0 | 0001 | 0 |
| * | 0000 0010 | 0 | 0001 | 0 |
|   | 0000 0011 | 1 | 0010 | 0 |
| * | 0000 0100 | 0 | 0001 | 0 |
|   | 0000 0101 | 1 | 0010 | 0 |
|   | 0000 0110 | 1 | 0010 | 0 |
|   | 0000 0111 | 0 | 0011 | 1 |
| * | 0000 1000 | 0 | 0001 | 0 |
|   | 0000 1001 | 1 | 0010 | 0 |
|   | 0000 1010 | 1 | 0010 | 0 |
|   | 0000 1011 | 0 | 0011 | 1 |
|   | 0000 1100 | 1 | 0010 | 0 |
|   | 0000 1101 | 0 | 0011 | 1 |
|   | 0000 1110 | 0 | 0011 | 1 |
|   | 0000 1111 | 1 | 0100 | 0 |
| * | 0001 0000 | 0 | 0001 | 0 |
|   | 0001 0001 | 1 | 0010 | 0 |
|   | 0001 0010 | 1 | 0010 | 0 |
|   | 0001 0011 | 0 | 0011 | 1 |
|   | 0001 0100 | 1 | 0010 | 0 |
|   | 0001 0101 | 0 | 0011 | 1 |
|   | 0001 0110 | 0 | 0011 | 1 |
|   | 0001 0111 | 1 | 0100 | 0 |
|   | 0001 1000 | 1 | 0010 | 0 |
|   | 0001 1001 | 0 | 0011 | 1 |
|   | 0001 1010 | 0 | 0011 | 1 |
|   | 0001 1011 | 1 | 0100 | 0 |
|   | 0001 1100 | 0 | 0011 | 1 |
|   | 0001 1101 | 1 | 0100 | 0 |
|   | 0001 1110 | 1 | 0100 | 0 |
|   | 0001 1111 | 0 | 0101 | 1 |
| * | 0010 0000 | 0 | 0001 | 0 |
|   | 0010 0001 | 1 | 0010 | 0 |
|   | 0010 0010 | 1 | 0010 | 0 |
|   | 0010 0011 | 0 | 0011 | 1 |
|   | 0010 0100 | 1 | 0010 | 0 |
|   | 0010 0101 | 0 | 0011 | 1 |
|   | 0010 0110 | 0 | 0011 | 1 |
|   | 0010 0111 | 1 | 0100 | 0 |
|   | 0010 1000 | 1 | 0010 | 0 |
|   | 0010 1001 | 0 | 0011 | 1 |
|   | 0010 1010 | 0 | 0011 | 1 |
|   | 0010 1011 | 1 | 0100 | 0 |
|   | 0010 1100 | 0 | 0011 | 1 |
|   | 0010 1101 | 1 | 0100 | 0 |
|   | 0010 1110 | 1 | 0100 | 0 |
|   | 0010 1111 | 0 | 0101 | 1 |

| | X 7:0 | P | Z 3:0 | P |
|---|---|---|---|---|
|   | 0011 0000 | 1 | 0010 | 0 |
|   | 0011 0001 | 0 | 0011 | 1 |
|   | 0011 0010 | 0 | 0011 | 1 |
|   | 0011 0011 | 1 | 0100 | 0 |
|   | 0011 0100 | 0 | 0011 | 1 |
|   | 0011 0101 | 1 | 0100 | 0 |
|   | 0011 0110 | 1 | 0100 | 0 |
|   | 0011 0111 | 0 | 0101 | 1 |
|   | 0011 1000 | 0 | 0011 | 1 |
|   | 0011 1001 | 1 | 0100 | 0 |
|   | 0011 1010 | 1 | 0100 | 0 |
|   | 0011 1011 | 0 | 0101 | 1 |
|   | 0011 1100 | 1 | 0100 | 0 |
|   | 0011 1101 | 0 | 0101 | 1 |
|   | 0011 1110 | 0 | 0101 | 1 |
| * | 0011 1111 | 1 | 0110 | 1 |
| * | 0100 0000 | 0 | 0001 | 0 |
|   | 0100 0001 | 1 | 0010 | 0 |
|   | 0100 0010 | 1 | 0010 | 0 |
|   | 0100 0011 | 0 | 0011 | 1 |
|   | 0100 0100 | 1 | 0010 | 0 |
|   | 0100 0101 | 0 | 0011 | 1 |
|   | 0100 0110 | 0 | 0011 | 1 |
|   | 0100 0111 | 1 | 0100 | 0 |
|   | 0100 1000 | 1 | 0010 | 0 |
|   | 0100 1001 | 0 | 0011 | 1 |
|   | 0100 1010 | 0 | 0011 | 1 |
|   | 0100 1011 | 1 | 0100 | 0 |
|   | 0100 1100 | 0 | 0011 | 1 |
|   | 0100 1101 | 1 | 0100 | 0 |
|   | 0100 1110 | 1 | 0100 | 0 |
|   | 0100 1111 | 0 | 0101 | 1 |
|   | 0101 0000 | 1 | 0010 | 0 |
|   | 0101 0001 | 0 | 0011 | 1 |
|   | 0101 0010 | 0 | 0011 | 1 |
|   | 0101 0011 | 1 | 0100 | 0 |
|   | 0101 0100 | 0 | 0011 | 1 |
|   | 0101 0101 | 1 | 0100 | 0 |
|   | 0101 0110 | 1 | 0100 | 0 |
|   | 0101 0111 | 0 | 0101 | 1 |
|   | 0101 1000 | 0 | 0011 | 1 |
|   | 0101 1001 | 1 | 0100 | 0 |
|   | 0101 1010 | 1 | 0100 | 0 |
|   | 0101 1011 | 0 | 0101 | 1 |
|   | 0101 1100 | 1 | 0100 | 0 |
|   | 0101 1101 | 0 | 0101 | 1 |
|   | 0101 1110 | 0 | 0101 | 1 |
| * | 0101 1111 | 1 | 0110 | 1 |

FIG.1B

| | X 7:0 | P | Z 3:0 | P |
|---|---|---|---|---|
| | 0110 0000 | 1 | 0010 | 0 |
| | 0110 0001 | 0 | 0011 | 1 |
| | 0110 0010 | 0 | 0011 | 1 |
| | 0110 0011 | 1 | 0100 | 0 |
| | 0110 0100 | 0 | 0011 | 1 |
| | 0110 0101 | 1 | 0100 | 0 |
| | 0110 0110 | 1 | 0100 | 0 |
| | 0110 0111 | 0 | 0101 | 1 |
| | 0110 1000 | 0 | 0011 | 1 |
| | 0110 1001 | 1 | 0100 | 0 |
| | 0110 1010 | 1 | 0100 | 0 |
| | 0110 1011 | 0 | 0101 | 1 |
| | 0110 1100 | 1 | 0100 | 0 |
| | 0110 1101 | 0 | 0101 | 1 |
| | 0110 1110 | 0 | 0101 | 1 |
| * | 0110 1111 | 1 | 0110 | 1 |
| | 0111 0000 | 0 | 0011 | 1 |
| | 0111 0001 | 1 | 0100 | 0 |
| | 0111 0010 | 1 | 0100 | 0 |
| | 0111 0011 | 0 | 0101 | 1 |
| | 0111 0100 | 1 | 0100 | 0 |
| | 0111 0101 | 0 | 0101 | 1 |
| | 0111 0110 | 0 | 0101 | 1 |
| * | 0111 0111 | 1 | 0110 | 1 |
| | 0111 1000 | 1 | 0100 | 0 |
| | 0111 1001 | 0 | 0101 | 1 |
| | 0111 1010 | 0 | 0101 | 1 |
| * | 0111 1011 | 1 | 0110 | 1 |
| | 0111 1100 | 0 | 0101 | 1 |
| * | 0111 1101 | 1 | 0110 | 1 |
| * | 0111 1110 | 1 | 0110 | 1 |
| * | 0111 1111 | 0 | 0111 | 0 |
| * | 1000 0000 | 0 | 0001 | 0 |
| | 1000 0001 | 1 | 0010 | 0 |
| | 1000 0010 | 1 | 0010 | 0 |
| | 1000 0011 | 0 | 0011 | 1 |
| | 1000 0100 | 1 | 0010 | 0 |
| | 1000 0101 | 0 | 0011 | 1 |
| | 1000 0110 | 0 | 0011 | 1 |
| | 1000 0111 | 1 | 0100 | 0 |
| | 1000 1000 | 1 | 0010 | 0 |
| | 1000 1001 | 0 | 0011 | 1 |
| | 1000 1010 | 0 | 0011 | 1 |
| | 1000 1011 | 1 | 0100 | 0 |
| | 1000 1100 | 0 | 0011 | 1 |
| | 1000 1101 | 1 | 0100 | 0 |
| | 1000 1110 | 1 | 0100 | 0 |
| | 1000 1111 | 0 | 0101 | 1 |

| | X 7:0 | P | Z 3:0 | P |
|---|---|---|---|---|
| | 1001 0000 | 1 | 0010 | 0 |
| | 1001 0001 | 0 | 0011 | 1 |
| | 1001 0010 | 0 | 0011 | 1 |
| | 1001 0011 | 1 | 0100 | 0 |
| | 1001 0100 | 0 | 0011 | 1 |
| | 1001 0101 | 1 | 0100 | 0 |
| | 1001 0110 | 1 | 0100 | 0 |
| | 1001 0111 | 0 | 0101 | 1 |
| | 1001 1000 | 0 | 0011 | 1 |
| | 1001 1001 | 1 | 0100 | 0 |
| | 1001 1010 | 1 | 0100 | 0 |
| | 1001 1011 | 0 | 0101 | 1 |
| | 1001 1100 | 1 | 0100 | 0 |
| | 1001 1101 | 0 | 0101 | 1 |
| | 1001 1110 | 0 | 0101 | 1 |
| * | 1001 1111 | 1 | 0110 | 1 |
| | 1010 0000 | 1 | 0010 | 0 |
| | 1010 0001 | 0 | 0011 | 1 |
| | 1010 0010 | 0 | 0011 | 1 |
| | 1010 0011 | 1 | 0100 | 0 |
| | 1010 0100 | 0 | 0011 | 1 |
| | 1010 0101 | 1 | 0100 | 0 |
| | 1010 0110 | 1 | 0100 | 0 |
| | 1010 0111 | 0 | 0101 | 1 |
| | 1010 1000 | 0 | 0011 | 1 |
| | 1010 1001 | 1 | 0100 | 0 |
| | 1010 1010 | 1 | 0100 | 0 |
| | 1010 1011 | 0 | 0101 | 1 |
| | 1010 1100 | 1 | 0100 | 0 |
| | 1010 1101 | 0 | 0101 | 1 |
| | 1010 1110 | 0 | 0101 | 1 |
| * | 1010 1111 | 1 | 0110 | 1 |
| | 1011 0000 | 0 | 0011 | 1 |
| | 1011 0001 | 1 | 0100 | 0 |
| | 1011 0010 | 1 | 0100 | 0 |
| | 1011 0011 | 0 | 0101 | 1 |
| | 1011 0100 | 1 | 0100 | 0 |
| | 1011 0101 | 0 | 0101 | 1 |
| | 1011 0110 | 0 | 0101 | 1 |
| * | 1011 0111 | 1 | 0110 | 1 |
| | 1011 1000 | 1 | 0100 | 0 |
| | 1011 1001 | 0 | 0101 | 1 |
| | 1011 1010 | 0 | 0101 | 1 |
| * | 1011 1011 | 1 | 0110 | 1 |
| | 1011 1100 | 0 | 0101 | 1 |
| * | 1011 1101 | 1 | 0110 | 1 |
| * | 1011 1110 | 1 | 0110 | 1 |
| * | 1011 1111 | 0 | 0111 | 0 |

FIG.1C

| | X 7:0 | P | Z 3:0 | P |
|---|---|---|---|---|
| | 1100 0000 | 1 | 0010 | 0 |
| | 1100 0001 | 0 | 0011 | 1 |
| | 1100 0010 | 0 | 0011 | 1 |
| | 1100 0011 | 1 | 0100 | 0 |
| | 1100 0100 | 0 | 0011 | 1 |
| | 1100 0101 | 1 | 0100 | 0 |
| | 1100 0110 | 1 | 0100 | 0 |
| | 1100 0111 | 0 | 0101 | 1 |
| | 1100 1000 | 0 | 0011 | 1 |
| | 1100 1001 | 1 | 0100 | 0 |
| | 1100 1010 | 1 | 0100 | 0 |
| | 1100 1011 | 0 | 0101 | 1 |
| | 1100 1100 | 1 | 0100 | 0 |
| | 1100 1101 | 0 | 0101 | 1 |
| | 1100 1110 | 0 | 0101 | 1 |
| * | 1100 1111 | 1 | 0110 | 1 |
| | 1101 0000 | 0 | 0011 | 1 |
| | 1101 0001 | 1 | 0100 | 0 |
| | 1101 0010 | 1 | 0100 | 0 |
| | 1101 0011 | 0 | 0101 | 1 |
| | 1101 0100 | 1 | 0100 | 0 |
| | 1101 0101 | 0 | 0101 | 1 |
| | 1101 0110 | 0 | 0101 | 1 |
| * | 1101 0111 | 1 | 0110 | 1 |
| | 1101 1000 | 1 | 0100 | 0 |
| | 1101 1001 | 0 | 0101 | 1 |
| | 1101 1010 | 0 | 0101 | 1 |
| * | 1101 1011 | 1 | 0110 | 1 |
| | 1101 1100 | 0 | 0101 | 1 |
| * | 1101 1101 | 1 | 0110 | 1 |
| * | 1101 1110 | 1 | 0110 | 1 |
| * | 1101 1111 | 0 | 0111 | 0 |
| | 1110 0000 | 0 | 0011 | 1 |
| | 1110 0001 | 1 | 0100 | 0 |
| | 1110 0010 | 1 | 0100 | 0 |
| | 1110 0011 | 0 | 0101 | 1 |
| | 1110 0100 | 1 | 0100 | 0 |
| | 1110 0101 | 0 | 0101 | 1 |
| | 1110 0110 | 0 | 0101 | 1 |
| * | 1110 0111 | 1 | 0110 | 1 |
| | 1110 1000 | 1 | 0100 | 0 |
| | 1110 1001 | 0 | 0101 | 1 |
| | 1110 1010 | 0 | 0101 | 1 |
| * | 1110 1011 | 1 | 0110 | 1 |
| | 1110 1100 | 0 | 0101 | 1 |
| * | 1110 1101 | 1 | 0110 | 1 |
| * | 1110 1110 | 1 | 0110 | 1 |
| * | 1110 1111 | 0 | 0111 | 0 |

| | X 7:0 | P | Z 3:0 | P |
|---|---|---|---|---|
| | 1111 0000 | 1 | 0100 | 0 |
| | 1111 0001 | 0 | 0101 | 1 |
| | 1111 0010 | 0 | 0101 | 1 |
| * | 1111 0011 | 1 | 0110 | 1 |
| | 1111 0100 | 0 | 0101 | 1 |
| * | 1111 0101 | 1 | 0110 | 1 |
| * | 1111 0110 | 1 | 0110 | 1 |
| * | 1111 0111 | 0 | 0111 | 0 |
| | 1111 1000 | 0 | 0101 | 1 |
| * | 1111 1001 | 1 | 0110 | 1 |
| * | 1111 1010 | 1 | 0110 | 1 |
| * | 1111 1011 | 0 | 0111 | 0 |
| * | 1111 1100 | 1 | 0110 | 1 |
| * | 1111 1101 | 0 | 0111 | 0 |
| * | 1111 1110 | 0 | 0111 | 0 |
| | 1111 1111 | 1 | 1000 | 0 |

FIG.2

| | X | | Z | |
|---|---|---|---|---|
| | 7:0 | P | 3:0 | P |
| * | 0000 0000 | 1 | 0000 | 1 |
| * | 0000 0001 | 0 | 0001 | 0 |
| * | 0000 0010 | 0 | 0001 | 0 |
| * | 0000 0100 | 0 | 0001 | 0 |
| * | 0000 1000 | 0 | 0001 | 0 |
| * | 0001 0000 | 0 | 0001 | 0 |
| * | 0010 0000 | 0 | 0001 | 0 |
| * | 0100 0000 | 0 | 0001 | 0 |
| * | 1000 0000 | 0 | 0001 | 0 |
| * | 0011 1111 | 1 | 0110 | 1 |
| * | 0101 1111 | 1 | 0110 | 1 |
| * | 0110 1111 | 1 | 0110 | 1 |
| * | 0111 0111 | 1 | 0110 | 1 |
| * | 0111 1011 | 1 | 0110 | 1 |
| * | 0111 1101 | 1 | 0110 | 1 |
| * | 0111 1110 | 1 | 0110 | 1 |
| * | 1001 1111 | 1 | 0110 | 1 |
| * | 1010 1111 | 1 | 0110 | 1 |
| * | 1011 0111 | 1 | 0110 | 1 |
| * | 1011 1011 | 1 | 0110 | 1 |
| * | 1011 1101 | 1 | 0110 | 1 |
| * | 1011 1110 | 1 | 0110 | 1 |
| * | 1100 1111 | 1 | 0110 | 1 |
| * | 1101 0111 | 1 | 0110 | 1 |
| * | 1101 1011 | 1 | 0110 | 1 |
| * | 1101 1101 | 1 | 0110 | 1 |
| * | 1101 1110 | 1 | 0110 | 1 |
| * | 1110 0111 | 1 | 0110 | 1 |
| * | 1110 1011 | 1 | 0110 | 1 |
| * | 1110 1101 | 1 | 0110 | 1 |
| * | 1110 1110 | 1 | 0110 | 1 |
| * | 1111 0011 | 1 | 0110 | 1 |
| * | 1111 0101 | 1 | 0110 | 1 |
| * | 1111 0110 | 1 | 0110 | 1 |
| * | 1111 1001 | 1 | 0110 | 1 |
| * | 1111 1010 | 1 | 0110 | 1 |
| * | 1111 1100 | 1 | 0110 | 1 |
| * | 0111 1111 | 0 | 0111 | 0 |
| * | 1011 1111 | 0 | 0111 | 0 |
| * | 1101 1111 | 0 | 0111 | 0 |
| * | 1110 1111 | 0 | 0111 | 0 |
| * | 1111 0111 | 0 | 0111 | 0 |
| * | 1111 1011 | 0 | 0111 | 0 |
| * | 1111 1101 | 0 | 0111 | 0 |
| * | 1111 1110 | 0 | 0111 | 0 |

FIG.3A

| 7:4 | 3:0 | 7:0 |
|---|---|---|
| 0 | 0 | 0 |
| 0 | 1 | 1 |
| 1 | 0 | 1 |
| 2 | 4 | 6 |
| 3 | 3 | 6 |
| 4 | 2 | 6 |
| 3 | 4 | 7 |
| 4 | 3 | 7 |

FIG.3B

| 7:4 | 3:0 | 7:0 |
|---|---|---|
| 0 | 2 | 2 |
| 1 | 1 | 2 |
| 2 | 0 | 2 |
| 1 | 2 | 3 |
| 2 | 1 | 3 |
| 0 | 4 | 4 |
| 1 | 3 | 4 |
| 2 | 2 | 4 |
| 3 | 1 | 4 |
| 4 | 0 | 4 |
| 1 | 4 | 5 |
| 2 | 3 | 5 |
| 3 | 2 | 5 |
| 4 | 1 | 5 |
| 4 | 4 | 8 |

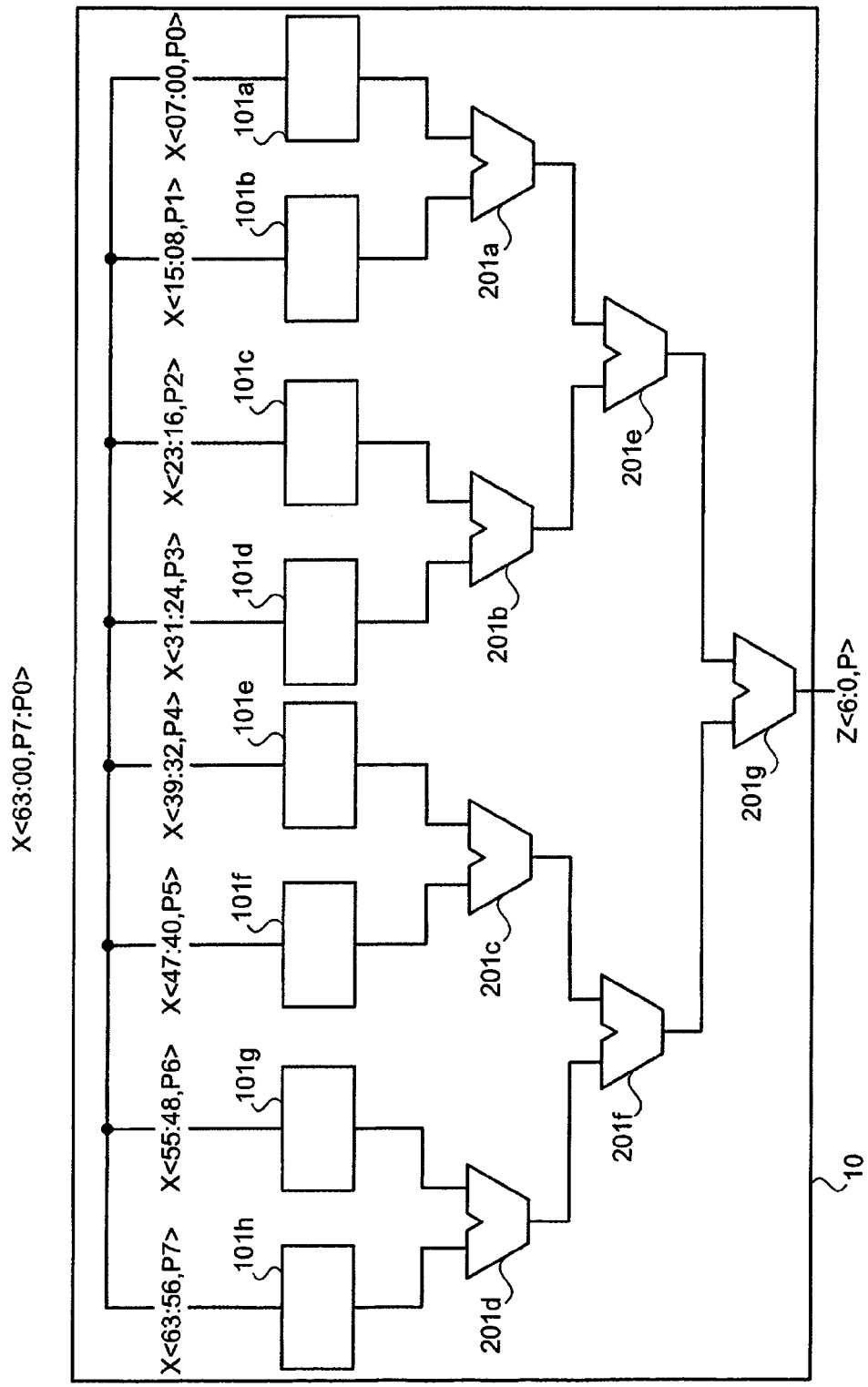

US 8,296,641 B2

PARITY GENERATION CIRCUIT, COUNTER CIRCUIT, AND COUNTING METHOD

CROSS REFERENCE TO RELATED APPLICATIONS

This is a continuing application, filed under 35 U.S.C. §111(a), of International Application PCT/JP2006/300749, filed Jan. 19, 2006, the contents of which are incorporated herein by reference.

BACKGROUND OF THE INVENTION

1. Field of the Invention

The present invention relates to a parity generation circuit, a counter circuit, and a counting method.

2. Description of the Related Art

A population count refers to counting the number of '1's in binary data, and some central processing units (CPUs) is configured to issue a population count (POPC) instruction to perform the counting.

The POPC instruction, formerly implemented by software emulation and not as an instruction set because of its low frequency of use, has been frequently used in recent years to calculate a hamming distance (the number of bits that differ between two bit strings). To increase the instruction processing speed, the POPC instruction is increasingly implemented by hardware. For example, Japanese Patent Application Laid-open No. 2005-165793 discloses a conventional technology to realize a circuit that executes the POPC instruction.

To improve reliability, a CPU is used that ensures the validity of data using a parity added to operation input/output data. When such CPU executes a POPC instruction by hardware, how to obtain the parity of the operation result of the POPC instruction becomes an issue.

Assume, for example, that the population count is performed using the above conventional technology, and that the parity of the operation result is calculated later using another circuit. In this case, the instruction processing time is prolonged by the time taken to calculate the parity. This reduces the effect of implementing the POPC instruction by hardware to process the instruction at high speed. Therefore, to avoid affecting the cycle time required for the operation, the parity needs to be calculated in the cycle time equal to or less than that of the operation. To accomplish this, the parity of the result of the POPC instruction needs to be predicted from input data.

To obtain the parity of the operation result without increasing the time taken to process the POPC instruction, the parity needs to be predicted by a separate circuit in parallel with the population count. This parity prediction is required to predict the parity of the operation result from the input data of the POPC instruction and its parity.

SUMMARY

It is an object of the present invention to at least partially solve the problems in the conventional technology.

According to an aspect of the present invention, there is provided a parity generation circuit that receives data and a parity of the data, and outputs a parity of count information on a specific item of the data represented as a base-n number (n: a natural number equal to or larger than 2), including a determining unit that determines that the number of specific items of the data represented as a base-n number is a specific value; and an inverting unit that outputs, as the parity of the count information, any one of a value of the parity of the data and an inverted value of the parity depending on a result of determination by the determining unit.

According to another aspect of the present invention, there is provided a counter circuit that receives data and a parity of the data, and outputs count information on a specific item of the data represented as a base-n number (n: a natural number equal to or larger than 2), and a parity of the count information, including a determining unit that determines that the number of specific items of the data represented as a base-n number is a specific value; and an inverting unit that outputs, as the parity of the count information, any one of a value of the parity of the data and an inverted value of the parity depending on a result of determination by the determining unit.

According to still another aspect of the present invention, there is provided a counting method for counting, upon receipt of data and a parity of the data, specific items of the data represented as a base-n number (n: a natural number equal to or larger than 2) to output count information and a parity of the count information, including determining that the number of specific items of the data represented as a base-n number is a specific value; and outputting, as the parity of the count information, any one of a value of the parity of the data and an inverted value of the parity depending on a determination result obtained at the determining.

According to still another aspect of the present invention, there is provided a counting method for counting, upon receipt of N-bit data (N: a natural number equal to or larger than 2) and a parity of the data, specific items of the data represented as a base-n number (n: a natural number equal to or larger than 2) to output count information and a parity of the count information, including dividing the N-bit data into n-bit portions (n: a natural number that satisfies $N>n\geq 1$); determining that the number of specific items of each of the n-bit portions represented as a base-n number is a specific value; outputting, as the parity of the count information, any one of a value of a parity of each of the n-bit portions and an inverted value of the parity of each of the n-bit portions depending on a determination result obtained at the determining; summing the count information of the n-bit portions; and summing parities of the count information of the n-bit portions.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 1A to 1C are tables showing correspondence between eight-bit input data and POP;

FIG. 2 is a table in which the parity of input data matches the parity of the POP;

FIG. 3A is a table showing combinations of POP in upper four bits and POP in lower four bits of eight-bit input data with POP of any one of "0", "1", "6", and "7";

FIG. 3B is a table showing combinations of POP in upper four bits and POP in lower four bits of eight-bit input data with POP of any one of "2", "3", "4", "5", and "8";

FIG. 6 is a block diagram of a population counter circuit corresponding to 64-bit input data.

DETAILED DESCRIPTION OF THE PREFERRED EMBODIMENTS

Figure 4:
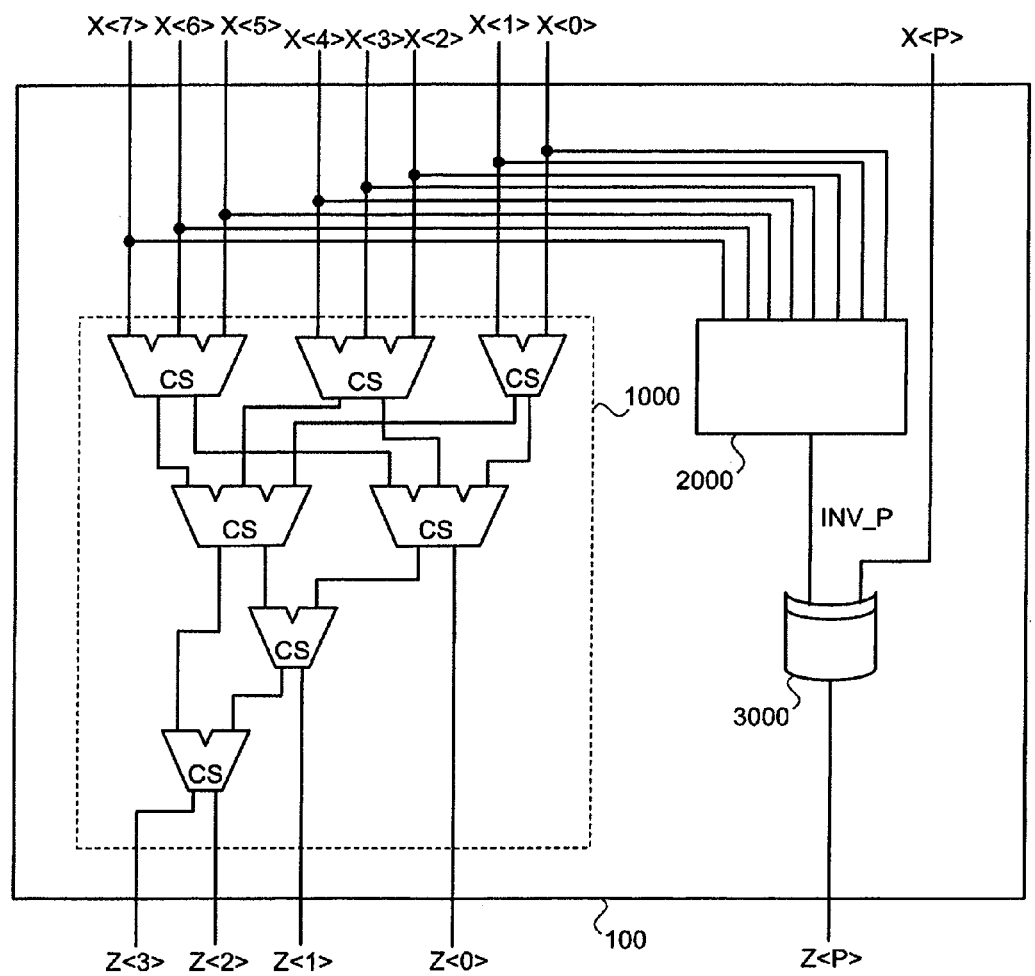
FIG. 4 is a block diagram of a population counter circuit corresponding to eight-bit input data according to an embodiment of the present invention.

Exemplary embodiments of the present invention are explained in detail below with reference to the accompanying drawings.

First described is a principle of a parity predicting system according to an embodiment of the present invention. FIGS. 1A to 1C are tables showing correspondence between eight-bit input data and the number of '1's (hereinafter, "POP") in the data represented as a binary number.

FIGS. 1A to 1C depict eight-bit data (X<7:0>) having 256 possible values, from "00000000" to "11111111", values of parity (X<P>) of the input data, POP (Z<3:0>), and parity (Z<P>) of the POP.

Because the input data is made up of eight bits, the POP can take values from "0000 (0 in the decimal notation)" to "1000 (8 in the decimal notation)". In FIGS. 1A to 1C, an odd parity is employed, and "1" is set as the parity of the eight-bit input data "00000000". To the POP "0000" of this input data, "1" is set as a parity.

FIG. 2 depicts data extracted from the data shown in FIGS. 1A to 1C (data marked with "*") in which the parity of the input data matches the parity of the POP. As can be seen from FIG. 2, when the parity of the input data matches the parity of the POP, the POP takes any one of "0000" (0 in the decimal notation), "0001" (1 in the decimal notation), "0110" (6 in the decimal notation), and "0111" (7 in the decimal notation).

On the other hand, in the case of data among the data shown in FIGS. 1A to 1C, in which the parity of the input data does not match the parity of the POP (data not marked with "*"), the POP takes any one of "0010" (2 in the decimal notation), "0011" (3 in the decimal notation), "0100" (4 in the decimal notation)", "0101" (5 in the decimal notation), and "1000" (8 in the decimal notation).

Based on this rule, the parity of POP can be predicted in the following manner. That is, in obtaining the POP of eight-bit input data, when the POP is any one of "0", "1", "6", and "7", it is expected that the parity of the POP is the same as the parity of the input data. When the POP has other values, it is expected that the parity of the POP is an inverted value of the parity of the input data.

In obtaining the POP of input data having a width of eight bits or more, the parity can be predicted by dividing the input data into eight-bit portions. Specifically, the parity of the POP of each eight-bit portion is predicted according to the above rule, and the parity of the POP of the input data can be predicted by summing the prediction results.

As described above, according to the embodiment, prediction is performed according to a POPC instruction from the CPU in parallel with the population count operation not to increase the execution time of the POPC instruction. Therefore, the cycle time of the parity predicting process is equal to or shorter than the cycle time of the population count operation. When the cycle time of the parity predicting process is equal to or shorter than that of the population count operation, the parity predicting process is masked by the population count operation, and does not affect the execution time of the POP instruction.

Although the POP of input data needs to be determined, it is sufficient if it can be determined whether the POP is any one of "0", "1", "6", and "7" in the decimal notation or any one of "2", "3", "4", "5", and "8" in the decimal notation. Therefore, the POP does not need to be calculated using the combination of adders as disclosed in Patent Document 1, and the execution speed can be increased by realizing a determining circuit using a decoder.

However, when the determination of the POP of the input data having an eight-bit width is implemented by the decoder, the circuit size increases. Consequently, the processing is performed by dividing the eight-bit input data into the upper four-bit data and the lower four-bit data.

FIG. 3A depicts all combinations of the POP of the upper four bits (<7:4>) and the POP of the lower four bits (<3:0>) when the POP of the eight-bit input data takes any one of "0", "1", "6", and "7" in the decimal notation. As shown in FIG. 3A, there are eight combinations in this case.

FIG. 3B depicts all combinations of the POP of the upper four bits and the POP of the lower four bits when the POP of the eight-bit input data takes any one of "2", "3", "4", "5", and "8" in the decimal notation. As shown in FIG. 3B, there are 15 combinations in this case.

Thus, it can be understood that, when the process is performed by dividing eight-bit input data into an upper-bit portion and a lower-bit portion, the circuit size for achieving the parity prediction can be reduced by determining whether the POP of the eight-bit input data is any one of "0", "1", "6", and "7" in the decimal notation consisting of eight combinations as compared to by determining whether the POP of the data is any one of "2", "3", "4", "5", and "8" in the decimal notation consisting of 15 combinations.

The following example describes determination as to whether the POP of eight-bit input data is any one of "0", "1", "6", and "7" in the decimal notation is made by dividing the input data into an upper-bit portion and a lower-bit portion. When the circuit size does not present a problem, whether the POP of eight-bit input data is any one of "2", "3", "4", "5", and "8" in the decimal notation can be determined by dividing the input data into an upper-bit portion and a lower-bit portion. Alternatively, the determination can be performed without dividing the eight-bit input data into upper four-bit data and lower four-bit data.

Explained below is a population counter circuit according to the present embodiment. FIG. 4 is a block diagram of a population counter circuit 100 corresponding to eight-bit input data. The population counter circuit 100 receives eight-bit input data (X<7:0>) and its parity (X<P>), and outputs a operation result (Z<3:0>) of the population count and its parity (Z<P>).

The population counter circuit 100 includes a population counting unit 1000, a parity predicting unit 2000, and a parity inverting circuit 3000.

The population counting unit 1000 receives the eight-bit input data (X<7:0>), counts POP of this data, and outputs the operation result (Z<3:0>). The population counting unit 1000 includes a combination of a CAS (Carry Save Adder), and a HA (Half Adder). The configuration of the population counting unit 1000 need not necessarily be as illustrated in FIG. 4, and can be, for example, as disclosed in Patent Document 1.

The parity predicting unit 2000 and the parity inverting circuit 3000 predict the parity of the operation result using the parity predicting system of the present embodiment. The parity predicting unit 2000 receives and decodes the eight-bit input data (X<7:0>). The parity predicting unit 2000 outputs 0 as an INV_P signal when the POP of the data is any one of "0", "1", "6", and "7" in the decimal notation, and otherwise outputs 1.

When the INV_P signal is 0, the parity inverting unit 3000 directly outputs the parity (X<P>) of the input data as the parity (Z<P>) of the operation result. When the INV_P signal is 1, the parity inverting unit 3000 outputs an inversion of the parity (X<P>) of the input data as the parity (Z<P>) of the operation result.

Figure 5A:
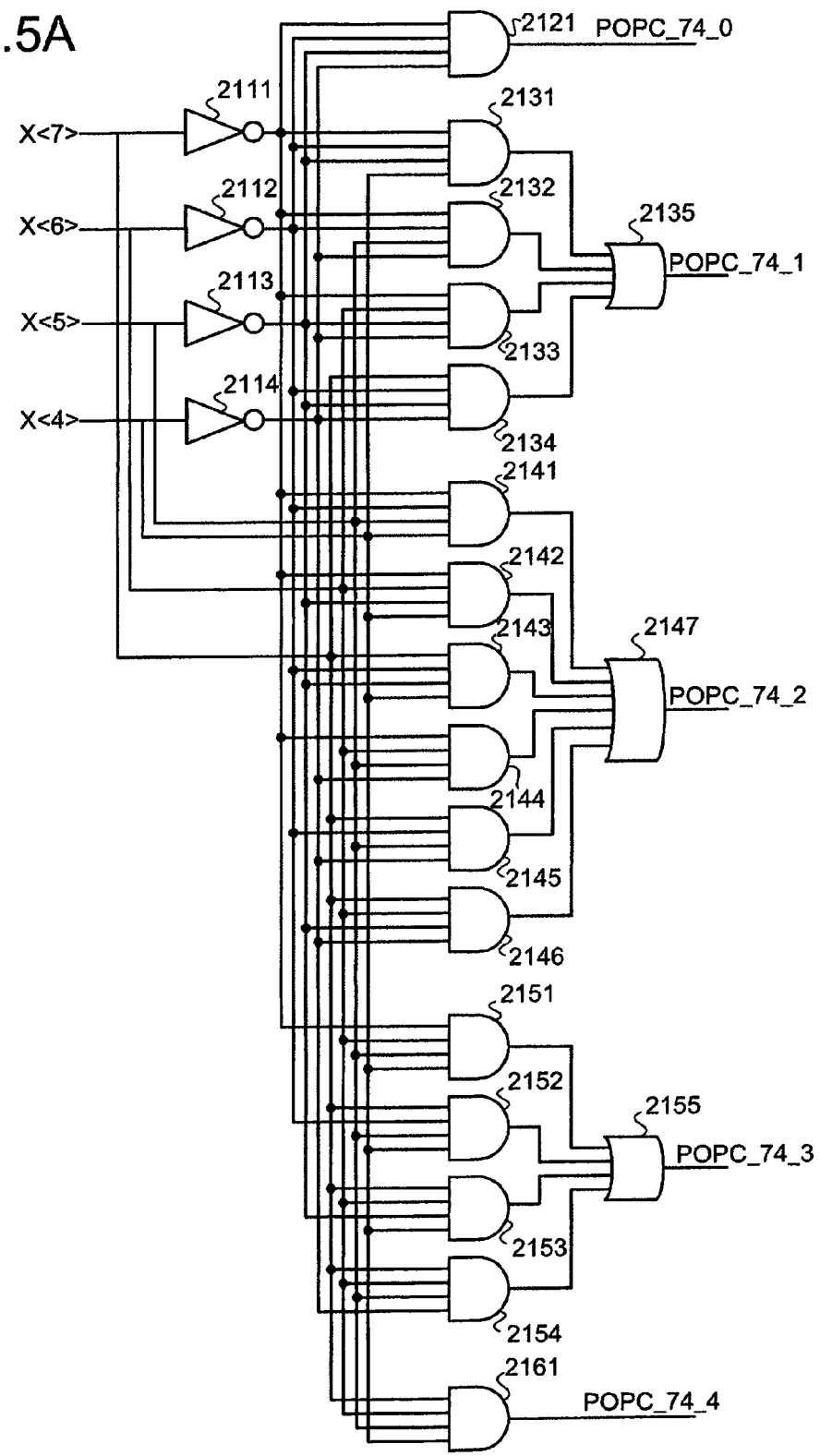
FIGS. 5A to 5C are block diagrams of a parity predicting unit shown in FIG. 4.
Figure 5B:
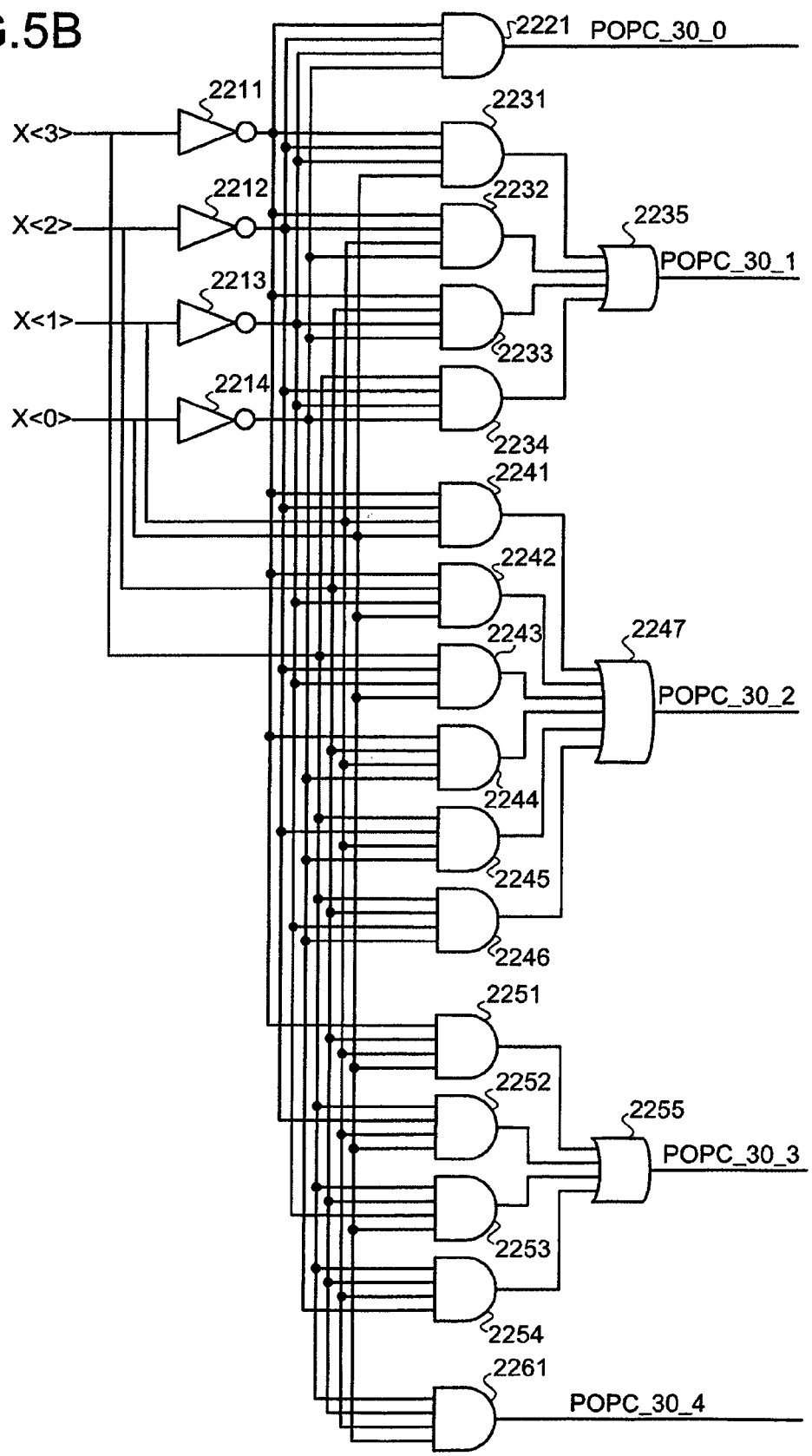
Figure 5C:
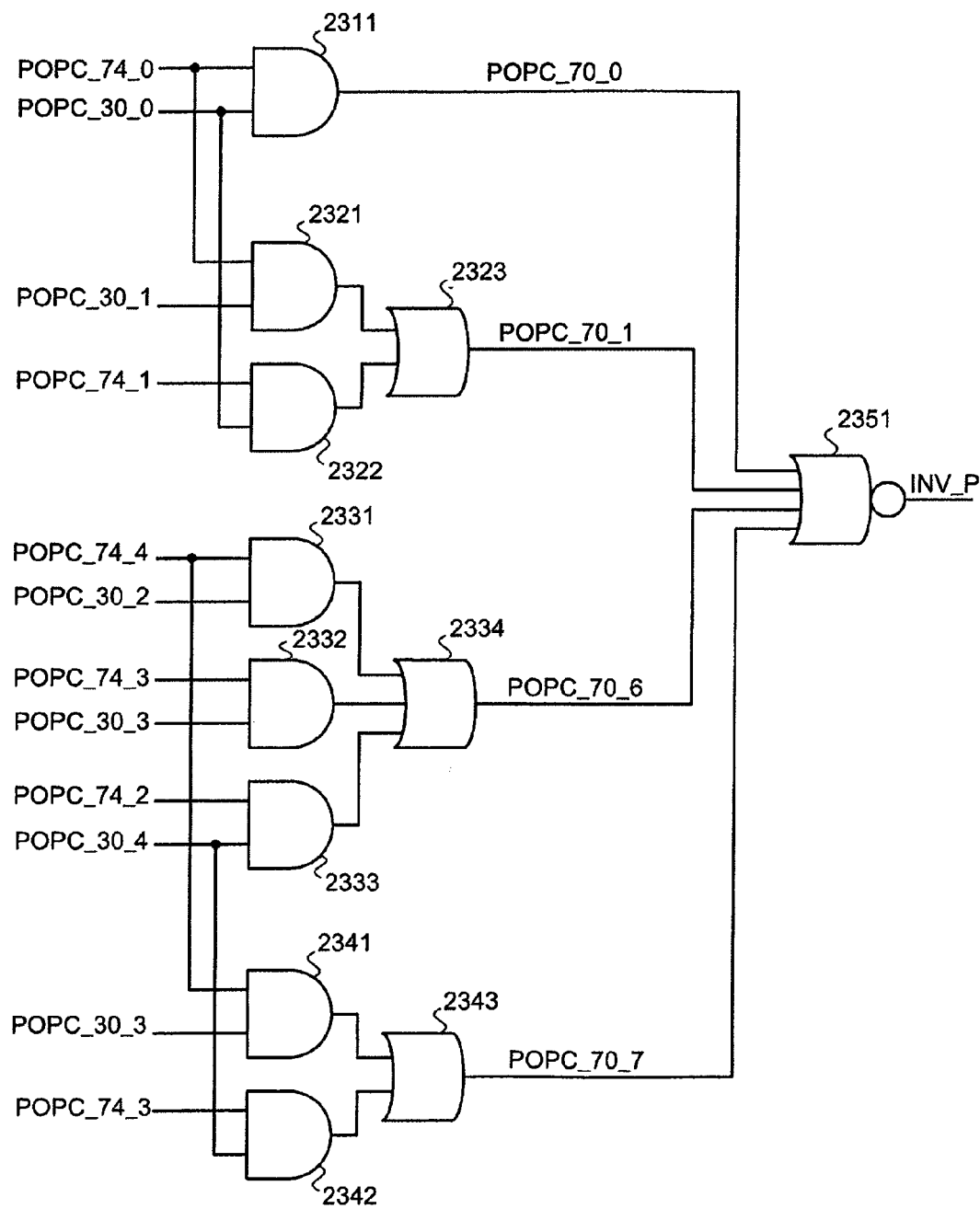

FIGS. 5A to 5C are block diagrams of a configuration of the parity predicting unit 2000. FIG. 5A depicts a circuit configuration for determination by decoding the POP of the upper four bits (X<7:4>) of the input data.

NOT circuits 2111 to 2114 invert the input bits X<7> to X<4>, respectively.

AND circuits 2121, 2131 to 2134, 2141 to 2146, 2151 to 2154, and 2161 are configured as decoding circuits that decode inputs of signals obtained by inverting a part or all of the input bits X<7> to X<4>, using the NOT circuits 2111 to 2114, so that only one circuit outputs 1 corresponding to a bit pattern of the input bits X<7> to X<4>, and other circuits output 0.

When the POP of the upper four bits is 0, i.e., when all bits are 0, the AND circuit 2121 outputs 1. This output is a POPC_74_0 signal.

When the POP of the upper four bits is 1, i.e., when one bit has 1, any one of the AND circuits 2131 to 2134 outputs 1. An OR circuit 2135 calculates a logical sum of these outputs, and outputs a POPC_74_1 signal.

When the POP of the upper four bits is 2, i.e., when two bits have 1, any one of the AND circuits 2141 to 2146 outputs 1. An OR circuit 2147 calculates a logical sum of these outputs, and outputs a POPC_74_2 signal.

When the POP of the upper four bits is 3, i.e., when three bits have 1, any one of the AND circuits 2151 to 2154 outputs 1. An OR circuit 2155 calculates a logical sum of these outputs, and outputs a POPC_74_3 signal.

When the POP of the upper four bits is 4, i.e., when all bits are 1, the AND circuit 2161 outputs 1. This output is a POPC_74_4 signal.

FIG. 5B depicts a circuit configuration for determining the POP of the lower four bits (X<3:0>) of the input data. The configuration of the circuit is similar to that shown in FIG. 5A, and therefore only signals to be output are explained.

A POPC_30_0 signal is 1 when the POP of the lower four bits is 0. A POPC_30_1 signal is 1 when the POP of the lower four bits is 1. A POPC_30_2 signal is 1 when the POP of the lower four bits is 2, and a POPC_30_3 signal is 1 when the POP of the lower four bits is 3. A POPC_30_4 signal is 1 when the POP of the lower four bits is "4" in the decimal notation.

FIG. 5C depicts a circuit configuration for determining whether the POP of the eight-bit input data (X<7:0>) is any one of "0", "1", "6", and "7" in the decimal notation.

AND circuits 2311, 2321 to 2322, 2331 to 2333, and 2341 to 2342 determine a value of the POP of the eight-bit input data (X<7:0>) based on combinations of determination results of the POP of the upper four bits (X<7:4>) and the POP of the lower four bits (X<3:0>).

The AND circuit 2311 outputs 1 when the POP of the upper four bits is 0 and when the POP of the lower four bits is 0, i.e., when the POPC_74_0 signal is 1 and when the POPC_30_0 signal is 1. This output is a POPC_70_0 signal.

The AND circuit 2321 outputs 1 when the POP of the upper four bits is 0 and when the POP of the lower four bits is "1" in the decimal notation, i.e., when the POPC_74_0 signal is 1 and when the POPC_30_1 signal is 1.

The AND circuit 2322 outputs 1 when the POP of the upper four bits is 1 and when the POP of the lower four bits is "0" in the decimal notation, i.e., when the POPC_74_1 signal is 1 and when the POPC_30_0 signal is 1. An OR circuit 2323 calculates a logical sum of the outputs of the AND circuit 2321 and the AND circuit 2322, and outputs a POPC_70_1 signal.

The AND circuit 2331 outputs 1 when the POP of the upper four bits is 4 and when the POP of the lower four bits is "2" in the decimal notation, i.e., when the POPC_74_4 signal is 1 and when the POPC_30_2 signal is 1.

The AND circuit 2332 outputs 1 when the POP of the upper four bits is 3 and when the POP of the lower four bits is "3" in the decimal notation, i.e., when the POPC_74_3 signal is 1 and when the POPC_30_3 signal is 1.

The AND circuit 2333 outputs 1 when the POP of the upper four bits is 2 and when the POP of the lower four bits is "4" in the decimal notation, i.e., when the POPC_74_2 signal is 1 and when the POPC_30_4 signal is 1. An OR circuit 2334 calculates a logical sum of the outputs of the AND circuit 2331, the AND circuit 2332, and the AND circuit 2333, and outputs a POPC_70_6 signal.

The AND circuit 2341 outputs 1 when the POP of the upper four bits is "4" in the decimal notation and when the POP of the lower four bits is "3" in the decimal notation, i.e., when the POPC_74_4 signal is 1 and when the POPC_30_3 signal is 1.

The AND circuit 2342 outputs 1 when the POP of the upper four bits is "3" in the decimal notation and when the POP of the lower four bits is "4" in the decimal notation, i.e., when the POPC_74_3 signal is 1 and when the POPC_30_4 signal is 1. An OR circuit 2343 calculates a logical sum of the outputs of the AND circuit 2341 and the AND circuit 2342, and outputs a POPC_70_7 signal.

An NOR circuit 2351 calculates a logical sum of the POPC_70_0 signal, the POPC_70_1 signal, the POPC_70_6 signal, and the POPC_70_7 signal, and outputs an inversion of the operation result as an INV_P signal.

With the configuration shown in FIGS. 5A to 5C, the INV_P signal as an output of the parity predicting unit 2000 is 0 when the POP of the eight-bit input data (X<7:0>) is any one of "0", "1", "6", and "7" in the decimal notation, and is 1 when the POP is other value.

Explained below is an application of the parity predicting system of the present embodiment to a population counter circuit corresponding to 64-bit input data. FIG. 6 is a block diagram of a population counter circuit 10 corresponding to 64-bit input data. The population counter circuit 10 receives 64-bit input data (X<63:00>) and its parities (X<7:P0>) each corresponding to eight bits, and outputs a operation result (Z<6:0>) of the population count and its parity (Z<P>).

The population counter circuit 10 includes population counter circuits 101a to 101h, and adder circuits 201a to 201g.

The population counter circuits 101a to 101h are similar to the population counter circuit 100, and each receive eight-bit input data and its parity and output a POP and its parity.

The population counter circuit 101a receives lowest eight bits (X<07:00>) of the input data and their parity (X<P0>). The population counter circuit 101b receives upper eight bits (X<15:08>) and their parity (X<P1>). The population counter circuit 101c receives upper eight bits (X<23:16>) and their parity (X<P2>). The population counter circuit 101d receives upper eight bits (X<31:24>) and their parity (X<P3>).

The population counter circuit 101e receives upper eight bits (X<39:32>) and their parity (X<P4>). The population counter circuit 101f receives upper eight bits (X<47:40>) and their parity (X<P5>). The population counter circuit 101g receives upper eight bits (X<55:48>) and their parity (X<P6>). The population counter circuit 101h receives upper eight bits (X<63:56>) of the input data and their parity (X<P7>).

The adder circuits 201a to 201g add POPs and parities, and output an addition result of the POPs and an addition result of the parities.

The adder circuit 201a adds together the addition result and the parity result from the population counter circuit 101a, and the addition result and the parity result from the population counter circuit 101b, respectively. The adder circuit 201b adds together the addition result and the parity result from the population counter circuit 101c, and the addition result and the parity result from the population counter circuit 101d, respectively. The adder circuit 201c adds together the addition result and the parity result from the population counter circuit 101e, and the addition result and the parity result from the population counter circuit 101f, respectively. The adder circuit 201d adds together the addition result and the parity result from the population counter circuit 101g, and the addition result and the parity result from the population counter circuit 101h, respectively.

The adder circuit 201e adds together the addition result and the parity result from the adder circuit 201a, and the addition result and the parity result from the adder circuit 201b, respectively. The adder circuit 201f adds together the addition result and the parity result from the adder circuit 201c, and the addition result and the parity result from the adder circuit 201d, respectively. The adder circuit 201g adds together the addition result and the parity result from the adder circuit 201e, and the addition result and the parity result from the adder circuit 201f, respectively. A result of the addition by the adder circuit 201g is output as the result of the population count (Z<6:0>) and the parity (Z<P>).

Figure 7:
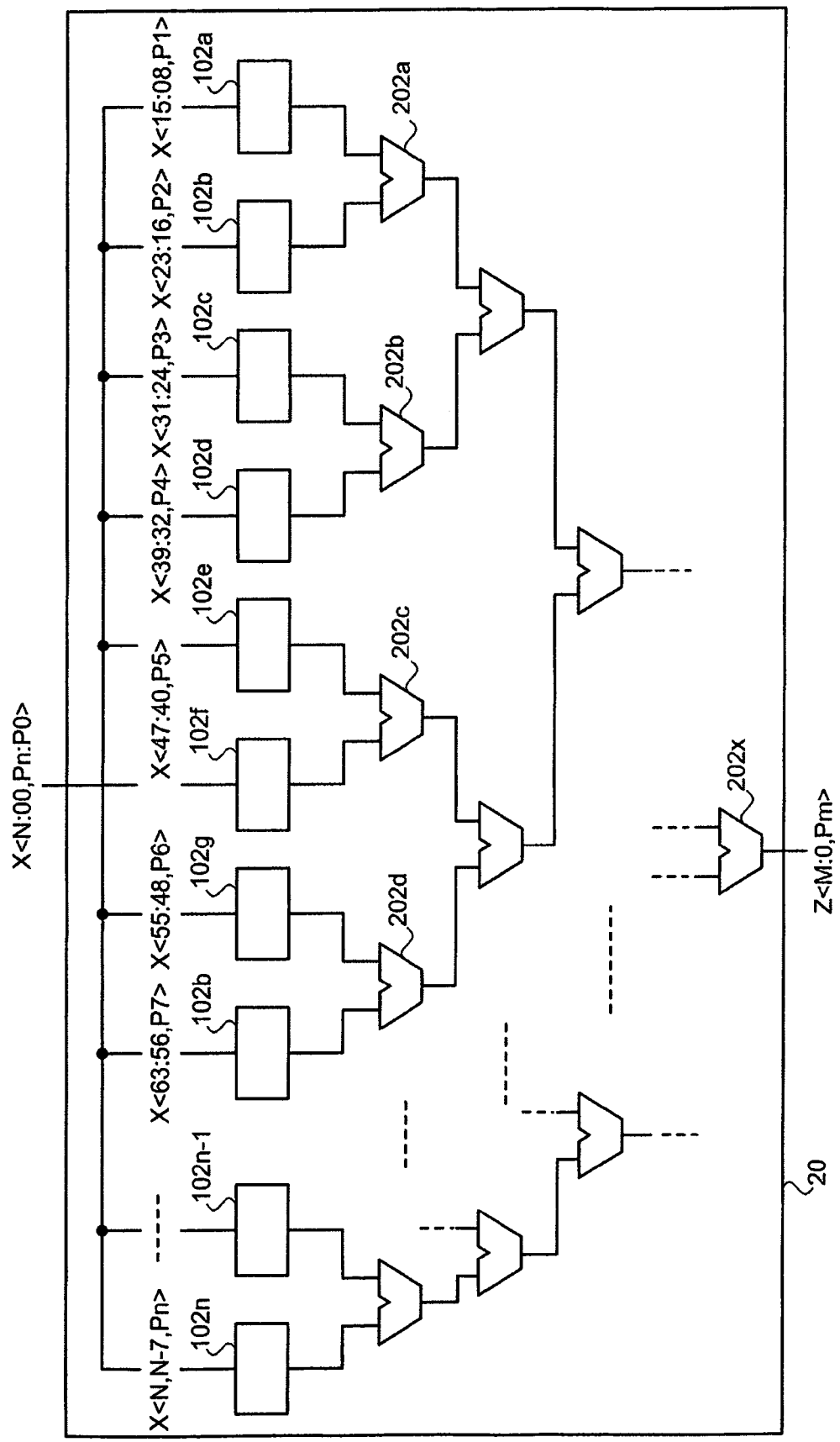
FIG. 7 is a block diagram of a population counter circuit corresponding to N-bit input data.

As described above, even when input data has a bit width larger than eight bits, the POP can be counted and the parity can be predicted with population counter circuits corresponding to eight-bit input data arranged in parallel and adder circuits that add the output results. Thus, a population counter circuit corresponding to a bit width larger than 64 bits can also be realized as shown in FIG. 7.

As set forth hereinabove, according to an embodiment of the present invention, the parity of a result of population count can be predicted at high speed without affecting population count operation.

Moreover, since input data is divided to determine the bit pattern, the circuit size can be reduced as compared to the case of determining the bit pattern based on all bits without dividing the input data.

Furthermore, a population counter circuit corresponding to data of any bit width can be realized.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A parity generation circuit that receives data and a parity of the data, and outputs a parity, which is generated from the data and the parity of the data, added to count information on a specific item of the data represented as a base-2 number, the specific item being 1, the parity generation circuit comprising:
   a determining unit that determines that a number of specific items of the data represented as a base-2 number is a specific value; and
   an inverting unit that outputs, as the parity added to the count information, a value of the parity of the data when the determining unit determines that the number of specific items is the specific value and an inverted value of the parity when the determining unit determines that the number of specific items is not the specific value.

2. The parity generating circuit according to claim 1, wherein
   the data is eight-bit data, and
   the determining unit decodes that the number of specific items of the data is any one of 0, 1, 6, and 7.

3. The parity generating circuit according to claim 1, wherein
   the data is eight-bit data, and
   the determining unit determines whether the number of specific items of the data is any one of 0, 1, 6, and 7 based on a combination of the number of specific items in upper four bits and the number of specific items in lower four bits of the data.

4. A counter circuit that receives data and a parity of the data, and outputs count information on a specific item of the data represented as a base-2 number and a parity, which is generated from the data and the parity of the data, added to the count information, the specific item being 1, the counter circuit comprising:
   a determining unit that determines that a number of specific items of the data represented as a base-2 number is a specific value; and
   an inverting unit that outputs, as the parity added to the count information, a value of the parity of the data when the determining unit determines that the number of specific items is the specific value and an inverted value of the parity when the determining unit determines that the number of specific items is not the specific value.

5. The counter circuit according to claim 4, wherein
   the data is eight-bit data, and
   the determining unit decodes that the number of specific items of the data is any one of 0, 1, 6, and 7.

6. The counter circuit according to claim 4, wherein
   the data is eight-bit data, and
   the determining unit determines whether the number of specific items of the data is any one of 0, 1, 6, and 7 based on a combination of the number of specific items in upper four bits and the number of specific items in lower four bits of the data.

7. A counting method for counting, upon receipt of data and a parity of the data, specific items of the data represented as a base-2 number to output count information and a parity, which is generated from the data and the parity of the data, added to the count information, the specific item being 1, the counting method comprising:
   determining that a number of specific items of the data represented as a base-2number is a specific value; and
   outputting, as the parity added to the count information, a value of the parity of the data when the determining determines that the number of specific items is the specific value and an inverted value of the parity when the determining determines that the number of specific items is not the specific value.

8. The counting method according to claim 7, wherein
   the data is eight-bit data, and
   the determining includes decoding that the number of specific items of the data is any one of 0, 1, 6, and 7.

9. The counting method according to claim 7, wherein
   the data is eight-bit data, and
   the determining includes determining whether the number of specific items of the data is any one of 0, 1, 6, and 7 based on a combination of the number of specific items in upper four bits and the number of specific items in lower four bits of the data.

10. A counting method for counting, upon receipt of N-bit data, N being a natural number equal to or larger than 2, and a parity of the data, specific items of the data represented as a base-2 number to output count information and a parity, which is generated from the data and the parity of the data, added to the count information, the specific item being 1, the counting method comprising:

dividing the N-bit data into n-bit portions, n being a natural number that satisfies $N > n \geq 1$;

determining that a number of specific items of each of the n-bit portions represented as a base-2 number is a specific value;

outputting, as the parity added to the count information, a value of a parity of each of the n-bit portions when the determining determines that the number of specific items is the specific value and an inverted value of the parity of each of the n-bit portions when the determining determines that the number of specific items is not the specific value;

summing the count information of the n-bit portions; and summing parities of the count information of the n-bit portions.

* * * * *

UNITED STATES PATENT AND TRADEMARK OFFICE
CERTIFICATE OF CORRECTION

PATENT NO. : 8,296,641 B2
APPLICATION NO. : 12/219313
DATED : October 23, 2012
INVENTOR(S) : Hideo Yamashita It is certified that error appears in the above-identified patent and that said Letters Patent is hereby corrected as shown below:

On the Title Page, Col. 2, Item (56) (Other Publications); Line 3, Delete "Algorthim Impementationin" and insert -- Algorithm Implementation --, therefor.
On the Title Page, Col. 2, Item (56) (Other Publications); Line 7, Delete "Algorthim Impementationin" and insert -- Algorithm Implementation --, therefor.

In the Claims:
Column 8, Line 22, In Claim 4, delete "base-2number" and insert -- base-2 number --, therefor.
Column 8, Line 53, In Claim 7, delete "base-2number" and insert -- base-2 number --, therefor.

Signed and Sealed this
Fourteenth Day of May, 2013

Teresa Stanek Rea
*Acting Director of the United States Patent and Trademark Office*